United States Patent [19]
Zediker et al.

[11] Patent Number: 5,715,270
[45] Date of Patent: Feb. 3, 1998

[54] HIGH EFFICIENCY, HIGH POWER DIRECT DIODE LASER SYSTEMS AND METHODS THEREFOR

[75] Inventors: Mark S. Zediker, Florissant; Robert R. Rice, Chesterfield; John M. Haake, St. Charles, all of Mo.

[73] Assignee: McDonnell Douglas Corporation, St. Louis, Mo.

[21] Appl. No.: 722,619

[22] Filed: Sep. 27, 1996

[51] Int. Cl.⁶ .................. H01S 3/091; H01S 3/00; G02B 6/28
[52] U.S. Cl. .................. 372/75; 372/109; 372/43; 385/24; 385/47
[58] Field of Search .................. 372/6, 23, 53, 372/75, 92, 108, 109, 43, 50; 385/24, 46, 47, 88, 89, 11; 359/122, 115, 127

[56] References Cited

U.S. PATENT DOCUMENTS

| | | | |
|---|---|---|---|
| 4,823,357 | 4/1989 | Casey | 372/92 |
| 5,048,911 | 9/1991 | Sang et al. | 372/109 |
| 5,202,893 | 4/1993 | Kubota et al. | 372/75 |
| 5,212,707 | 5/1993 | Heidel et al. | 372/50 |
| 5,299,222 | 3/1994 | Shannon et al. | 372/75 |
| 5,369,661 | 11/1994 | Yamaguchi et al. | 372/75 |
| 5,495,490 | 2/1996 | Rice et al. | 372/34 |

OTHER PUBLICATIONS

Operator's Manual For Collimated Diode Laser Arrays (Models LM-8, LM-12), McDonnell Douglas Aerospace, pp. 1-40 (no date available).

Primary Examiner—Brian Healy
Assistant Examiner—Luong-Quyen T. Phan
Attorney, Agent, or Firm—Raymond Powell; Robert Westerlund

[57] ABSTRACT

A direct diode laser system includes N laser head assemblies (LHAs) generating N output beams, N optical fibers receiving respective N output beams and generating N received output beams, and a torch head recollimating and focusing the N received output beams onto a single spot. Preferably, each of the laser head assemblies of the direct diode laser system includes M modules generating M laser beams, wherein each of the M laser beams has a corresponding single wavelength of light, M-1 dichroic filters, wherein each of the M-1 dichroic filter transmits a corresponding one of the M laser beams and reflects all other wavelengths, and a fiber coupling device collecting the M laser beams to produce a respective one of the N output beams. In an exemplary case, the M-1 dichroic filters function as band pass filters. A method of generating a high fluence, high power laser beam is also described.

24 Claims, 7 Drawing Sheets

HIGH EFFICIENCY, HIGH POWER DIRECT DIODE LASER SYSTEMS AND METHODS THEREFOR

BACKGROUND OF THE INVENTION

The present invention relates generally to diode laser array systems. More specifically, the present invention relates to high efficiency, high power direct diode laser systems.

In numerous applications such as laser tracking, laser guidance and laser imaging, it is desirable to produce a high power coherent laser output. Moreover, high power coherent laser systems find applications in such diverse fields as offensive and defensive weapon systems, e.g., non-visible light illuminators for special operation forces and protective laser grids, as well as material processing, e.g., welding, cutting, heat treating and ablating, and medicine, e.g., surgical and diagnostic aides.

In the earliest laser systems, single semiconductor lasers were utilized to provide a coherent source of laser output. These single semiconductor lasers were limited in the amount of power which they could provide due to their structural limitations and limited efficiency. More recently, arrays of semiconductor lasers have also been utilized in which adjacent emitters of the array of semiconductor lasers spaced upon the same substrate are coupled together. One such laser array system was disclosed in commonly assigned U.S. Pat. No. 5,212,707 to Heidel et al., which is incorporated herein by reference for all purposes.

FIG. 1 illustrates a one-dimensional semiconductor laser array 10 according to U.S. Pat. No. 5,212,707, which is mounted on a heatsink 12. The semiconductor laser array 10 has an associated lens assembly 22, 24 for collimating the laser array's output, which is positioned adjacent to the emitting facet of the semiconductor laser array 10. Lens assembly 22, 24 is attached to the ears 25 of the heatsink 12. The emitters 20 of the array 10 are supplied with power from an external power supply via wires 18, a standoff pad 16 and a power lead 14. In an exemplary case, the semiconductor laser array 10 shown in FIG. 1, includes ten individual emitters 20; and number of emitters 20 may be employed as determined by the requirements of the particular application.

Once the semiconductor laser array 10 has been fabricated, mounted and powered, the output of the semiconductor laser array's emitters 20 must be collimated in order to obtain the desired collimated output. The lens assembly, as shown in FIG. 1, which is designed to collimate the output of the semiconductor laser array 10, includes a first refractive lens 22, typically of a biconvex design, and a second binary optical element 24, which is essentially a diffractive lens. The refractive biconvex lens 22 collimates the fast axis of each emitter 20 while the binary optical element 24 serves to collimate the slow axis of each emitter 20 and correct all spherical aberrations including those introduced by the collimation performed by the refractive lens 22.

The binary optical element 24 includes a substrate on which a binary optical diffraction pattern 26 is etched. Generally, the materials of the refractive lens 22 and the binary optical element 24 have substantially equivalent refractive indices such that minimal refraction occurs at the interface between the refractive lens 22 and the binary optical element 24. The binary optical element 24 has a back surface 27 positioned adjacent to the front surface 28 of the refractive lens 24 and a front surface 28 on which the binary optic diffraction pattern 26 is etched. Since the binary optical diffraction pattern 26 is produced in accordance with typical binary optic technology, as well known to those of ordinary skill in the art (See U.S. Pat. No. 4,846,552.), further discussion of this technology will not be provided.

The binary optic diffraction pattern 26 is typically an eight phase level structure (although a two, four, or sixteen-phase level structure could also be utilized) which corrects for optical path differences inherent in the divergent output light of an emitter of a semiconductor laser array. Thus, the rays of light which exit the binary optic element 24 will have all travelled equal optical pathlengths, defined as a physical pathlength multiplied by the index of refraction of the material through which the light rays travelled which are equal or varied from that equal optical pathlength by only an integer multiple of the wavelength of the light being emitted. An eight level binary optic diffractive pattern 26 is shown schematically in FIG. 1.

A two-dimensional semiconductor laser array can be fabricated from a plurality of the one-dimensional semiconductor laser arrays 10 shown in FIG. 1. The one-dimensional semiconductor laser arrays 10 are stacked as shown in FIG. 2 within a heatsink which serves as a holding or clamping fixture 70. The clamping fixture 70 is designed such that the one-dimensional semiconductor laser arrays 10 may be stacked on top of one another so that the outputs of each one-dimensional semiconductor laser array are substantially parallel to the outputs of the other semiconductor laser arrays.

Once the one-dimensional semiconductor laser arrays 10 have been mounted within the clamping fixture 70, the collimating lenses are aligned and attached. The fabrication of the collimating lenses is done in a manner identical to that previously discussed such that the refractive lens 22 is cemented to the binary optical element 24 which has been designed to collimate the laser output of each emitter 20. The alignment and attachment of the collimating lenses is accomplished in a sequential fashion for optimum efficiency. The collimating lenses 80a associated with the first one-dimensional semiconductor laser array 10a are positioned as previously described such that the optical axes of each emitter 20 of the semiconductor laser array 10 are substantially aligned with the center of the collimating lens assembly 80a.

The second collimating lens assembly 80b is then placed in front of a second one-dimensional semiconductor laser array 10b and is held in position by means of a vacuum chuck 76 connected by a vacuum line to a vacuum source, as shown in FIG. 3. The two-dimensional semiconductor laser array 10 is then supplied power such that the emitters 20 produce a light output. A transform lens 72 is positioned within the path of the light emitted from the first and second one-dimensional semiconductor laser arrays. The transform lens 72 may be a plano-convex or a biconvex lens, as shown in FIG. 3, such that a simulated far field will appear at the focal plane of the transform lens 72 when the input light to the transform lens 72 is collimated. To determine the simulated far field, when all beams of light overlap at the focal plane of the transform lens 72, a line scan detector 74 is positioned at the focal plane. The output of the line scan detector is monitored to determine if proper collimation has been achieved. The position of the second collimating lens assembly 80b is varied until proper collimation is observed at the focal plane of the transform lens. Once proper collimation is observed, the position of the second collimating lens assembly 80b is preserved by fixing the lens assembly in position in the ears 25 of the clamping fixture 70. An identical alignment procedure is done for each lens assembly and its corresponding one-dimensional semiconductor laser array 10, until the lens assembly for each semiconductor laser array 10 has been properly aligned such that the light is collimated and focused at the simulated far field.

The two-dimensional laser array when properly supplied with power produces a single collimated spot of laser output in the far field. By utilizing a plurality of one-dimensional semiconductor laser arrays 10 whose outputs may be combined, the output power of the two-dimensional semiconductor laser array may be quite high. For example, 25 watts of continuous wave laser energy was produced by a two-dimensional semiconductor laser array consisting of twelve one-dimensional semiconductor laser arrays with each one-dimensional semiconductor laser array having twenty one emitters. Additionally, the overall efficiency of the laser array from electrical input to power in the central lobe was approximately 26%.

U.S. Pat. No. 5,299,222 discloses an alternative approach to producing a high power laser diode system that collects and concentrates laser output from a stack of diode laser bars in a form that is useful and flexible for pumping a laser, e.g., a solid state laser. As shown schematically in FIG. 4, the light beam output of stacked diode laser bars is coupled into a plurality of optical fibers. The output light beams from the fibers may be used to pump a laser resonator. The fibers can be grouped at various end points of a solid-state laser cavity for efficient end-pumping. In FIG. 4, a light beam 11 is emitted by a plurality of diode laser bars in a diode laser bar stack 13, and light from a selected group of the bars is collected by one of a plurality of cylindrical lenses 15 positioned adjacent to but spaced apart from each diode bar in the stack 13. Each diode laser bar may have an aspect ratio (length-to-width) as high as 10,000:1, or even higher, and the cylindrical lenses 15 are interposed to reduce the beam divergence angle in a first direction, relative to the beam divergence angle in a second, perpendicular direction, so that the resulting beam divergence angle in each of the two directions is roughly the same.

Two or more turning mirrors 17A, 17B, 17C and 17D separate mutually exclusive portions of the light beam 11 into non-overlapping light beam components 19A, 19B, 19C and 19D, respectively, and at least one pump light beam component, such as 19E, is optionally defined by a portion of the light beam 11 that does not encounter a turning mirror. Each light beam component 19A, 19B, 19C, 19D and 19E is then focussed by suitable focusing optics 21A, 21B, 21C, 21D and 21E, respectively, into a corresponding multimode optical fiber 23A, 23B, 23C, 23D and 23E, respectively, with the diameters of the fibers being chosen to fully capture the optical beam intended for that fiber. Preferably, the sine of the convergence angle as a light beam arrives at a light-receiving end of a fiber is less than the numerical aperture NA of that fiber. In one embodiment, each optical fiber has a diameter of about 500 μm, but this fiber diameter may be as large as a few mm. Each of the focusing optics 21j (j=A, B, C, D or E) may be a lens with a short focal length, such as f=6.35 mm, and is intended to cause the resulting beam to converge to an entrance diameter, measured at the entrance of the corresponding fiber 23j, that is about 25 percent of the diameter of the portion of the pump light beam 11 that arrives at the focusing optics 21j.

The numerical aperture NA of the multimode fiber 23j lies in the range 0.15–0.3 but may be as high as 0.6. Each optical fiber 23j delivers the component pump light beam propagating therein to a selected position and with a selected angular orientation relative to the laser cavity to be pumped by this collection of component pump light beams. Each optical fiber 23j is provided with an anti-reflective coating at the diode laser wavelength P, and the coating is either applied directly to the fiber end or to a separate glass window that is bonded to the light-receiving end of that fiber. The core material of the fiber 23j may be glass, and the cladding material of the fiber may be glass or plastic, with a smaller refractive index than the core refractive index, which determines by the numerical aperture of the fiber in a manner well known in the art.

It will be appreciated that expansion of the systems discussed immediately above would require both a large amount of real estate and complex optic assemblies to couple the outputs of a plurality of the disclosed output modules to a single spot. For example, the presence of lens 72 in FIG. 3 suggests the need for a focusing lens associated with each module; FIG. 4 suggests that a plurality of lenses 21 are needed to efficiently couple the output of a single diode laser array. It would be desirable for a plurality of semiconductor laser arrays to produce a single spot of high intensity laser output using a simple and robust optical subsystem. Furthermore, it would be desirable for a plurality of semiconductor laser arrays to be mounted evenly and the outputs thereof collimated in such a manner as to fill the available aperture to thereby provide a substantially constant intensity across the single spot of laser output produced.

SUMMARY OF THE INVENTION

Based on the above and foregoing, it can be appreciated that there presently exists a need in the art for a diode laser system which overcomes the above-described deficiencies.

An object according to the present invention is to provide a direct diode laser system generating a high fluence level at a workpiece.

Another object according to the present invention is to provide a direct diode laser system which generates a high power laser beam. According to one aspect of the present invention, the high power laser beam can be focused onto a single spot for interaction with a workpiece. According to another aspect of the present invention, the high power laser beam may be directed into one end of a solid state laser.

A still further object of the present invention is to provide a direct diode laser system which generates a high fluence level at a workpiece using dichroic coupling of multiple frequency collimated laser beams. Advantageously, all of the collimated laser beams can be generated using laser diode arrays.

Yet another object of the present invention is to provide a direct diode laser system which generates a high fluence level at a workpiece using both dichroic and polarization coupling of multiple frequency collimated laser beams. Advantageously, all of the collimated laser beams can be generated using laser diode arrays.

An additional object of the present invention is to provide a direct diode laser system which generates a high fluence level at a workpiece by simultaneously coupling thousands of collimated laser diode outputs into a single fiber via a single lens.

Another object of the present invention is to provide a direct diode laser system which generates a linearly scalable high power level output.

These and other objects, features and advantages of the present invention are provided by a direct diode laser system which includes N laser head assemblies (LHAs) generating N output beams, N optical fibers receiving respective ones of the N output beams and generating N received output beams, and a torch head recollimating and focusing the N received output beams onto a single spot. According to one aspect of the invention, each of the laser head assemblies of the direct diode laser system includes M modules generating M laser beams, wherein each of the M laser beams has a corresponding single wavelength of light, M-1 dichroic filters, wherein each of the M-1 dichroic filter transmits a corresponding one wavelength of the M laser beams and reflects all other wavelengths of the M laser beams, and a fiber coupling device collecting the M laser beams to produce a respective one of the N output beams.

These and other objects, features and advantages of the present invention are provided by a direct diode laser system, including N laser head assemblies (LHAs) generating N output beams, wherein each of the N laser head assemblies includes M first modules generating M first laser beams, wherein each of the M first laser beams has a corresponding single wavelength of light, M-1 first dichroic filters defining a first optical waveguide for directing all of the M first laser beams into a first optical path, wherein each of the M-1 first dichroic filters transmits a corresponding one of the M first laser beams having a respective wavelength and reflects all other wavelengths of the M first laser beams, a fiber coupling device disposed adjacent to the first optical path for collecting the M first laser beams to produce a respective one of the N output beams, N optical fibers receiving respective N output beams and generating N received output beams, and a torch head recollimating and focusing the N received output beams on a single spot.

These and other objects, features and advantages according to the present invention are provided by a method for generating a high energy laser beam, including steps for:

(a) generating P collimated laser beams having an Mth wavelength;
(b) repeating step (a) M times so as to produce M×P collimated laser beams having M different wavelengths;
(c) coupling the M×P collimated laser beams into an optical path;
(d) coupling the M×P collimated laser beams into an ith optical fiber to thereby produce a corresponding ith output laser beam, where i=1 to N;
(e) repeating steps (a) through (d) N times to thereby generate N output laser beams;
(f) recollimating the N output laser beams to produce N recollimated laser beams; and
(g) focusing the N recollimated laser beams onto a single spot.

These and other objects, features and advantages of the invention are disclosed in or will be apparent from the following description of preferred embodiments.

BRIEF DESCRIPTION OF THE DRAWINGS

These and various other features and aspects of the present invention will be readily understood with reference to the following detailed description taken in conjunction with the accompanying drawings, in which.

DETAILED DESCRIPTION OF THE INVENTION

Figure 5:
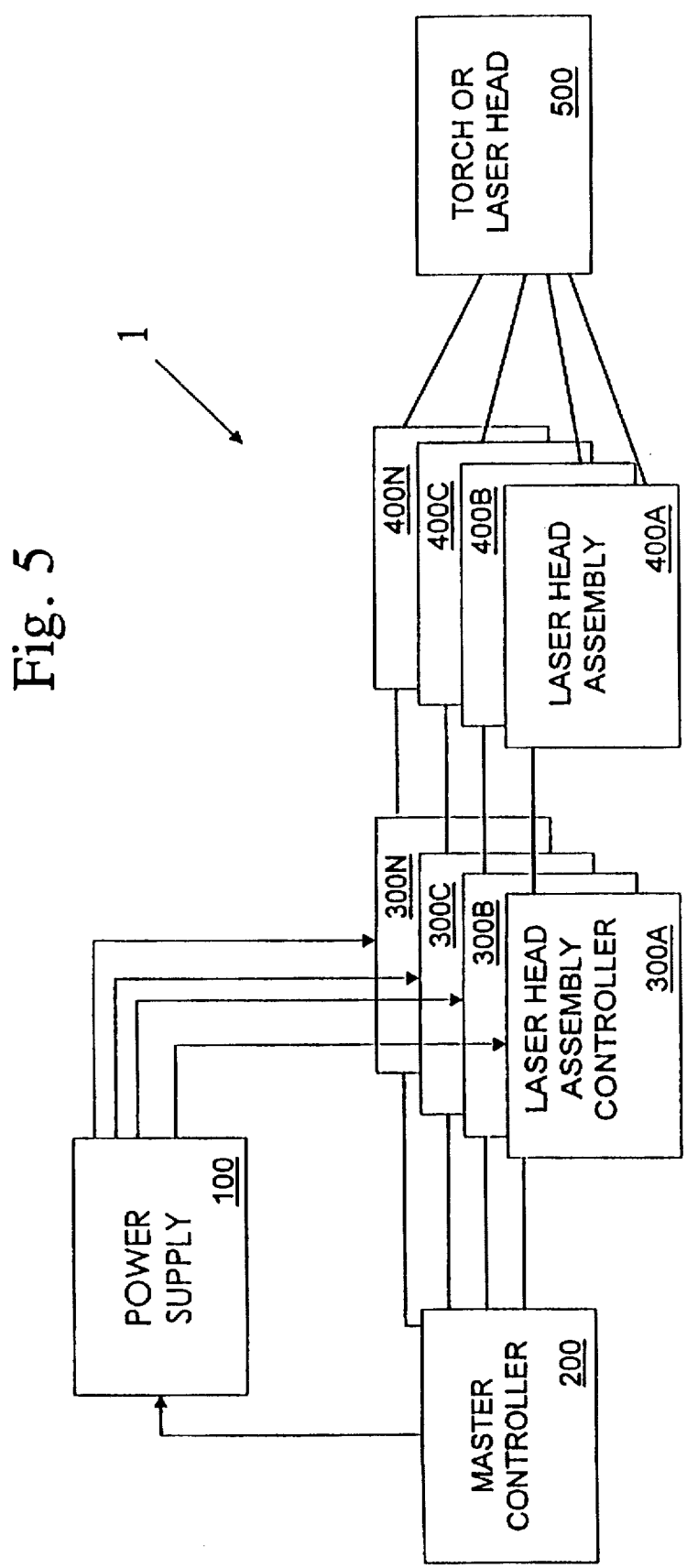
FIG. 5 is a high level block diagram of a high efficiency, high power direct diode laser system according to the present invention.

FIG. 5 is a high level block diagram of the high efficiency, high power direct diode laser system (DLS) 1 according to alternate preferred embodiments of the present invention. As illustrated in FIG. 5, the DLS 1 includes a power supply 100 providing power to both a controller 200 and N laser head assembly (LHA) controllers generally denoted 300. N laser head assemblies (LHAs) generally denoted 400 receive the output power of the LHA controllers 300, respectively, and provide N optical output laser beams to a torch head 500 via N optical fibers. It should be mentioned that the torch head 500 advantageously can be augmented by a laser head 510 (See FIG. 9.), and, thus, the alternative designation in FIG. 5.

Preferably, the number N of LHA controllers 300 and LHA's 400 can be varied as required to provide a desired output power of the DLS 1. In an exemplary case, 4 LHA controllers 300A, 300B, 300C and 300N providing electrical power to 4 LHAs 400A, 400B, 400C and 400N, respectively, are included in the DLS 1. The block diagram of FIG. 5 illustrates a DLS 1, in which the optical output laser beams of 4 LHAs 400, each producing 800 watts of power, are combined to deliver over 3200 watts of cw power to a single focusing lens. As discussed in greater detail below with respect to FIG. 9, the output of each respective LHA 400 advantageously can be fiber coupled and at the distal end of each fiber (approximately 1 mm diameter) they can be recollimated. The 4 collimated laser sources, i.e., the 4 output optical beams, preferably are collected by a single lens, which focuses the 3200 watts of total power onto a single point. It will be appreciated that this latter technique is commonly used in industrial laser systems to increase fluence on the work piece.

In an exemplary embodiment of the DLS 1 of FIG. 5, the power supply provides DC power to controller 200 and LHA controllers 300. Preferably, controller 200 acts as a master controller with respect to the N LHA controllers 300, which act as slave controllers. It should also be mentioned that each of the N LHA controllers 300 controls and varies the output optical beam of the respective LHA 400, as discussed in greater detail below.

Figure 6:
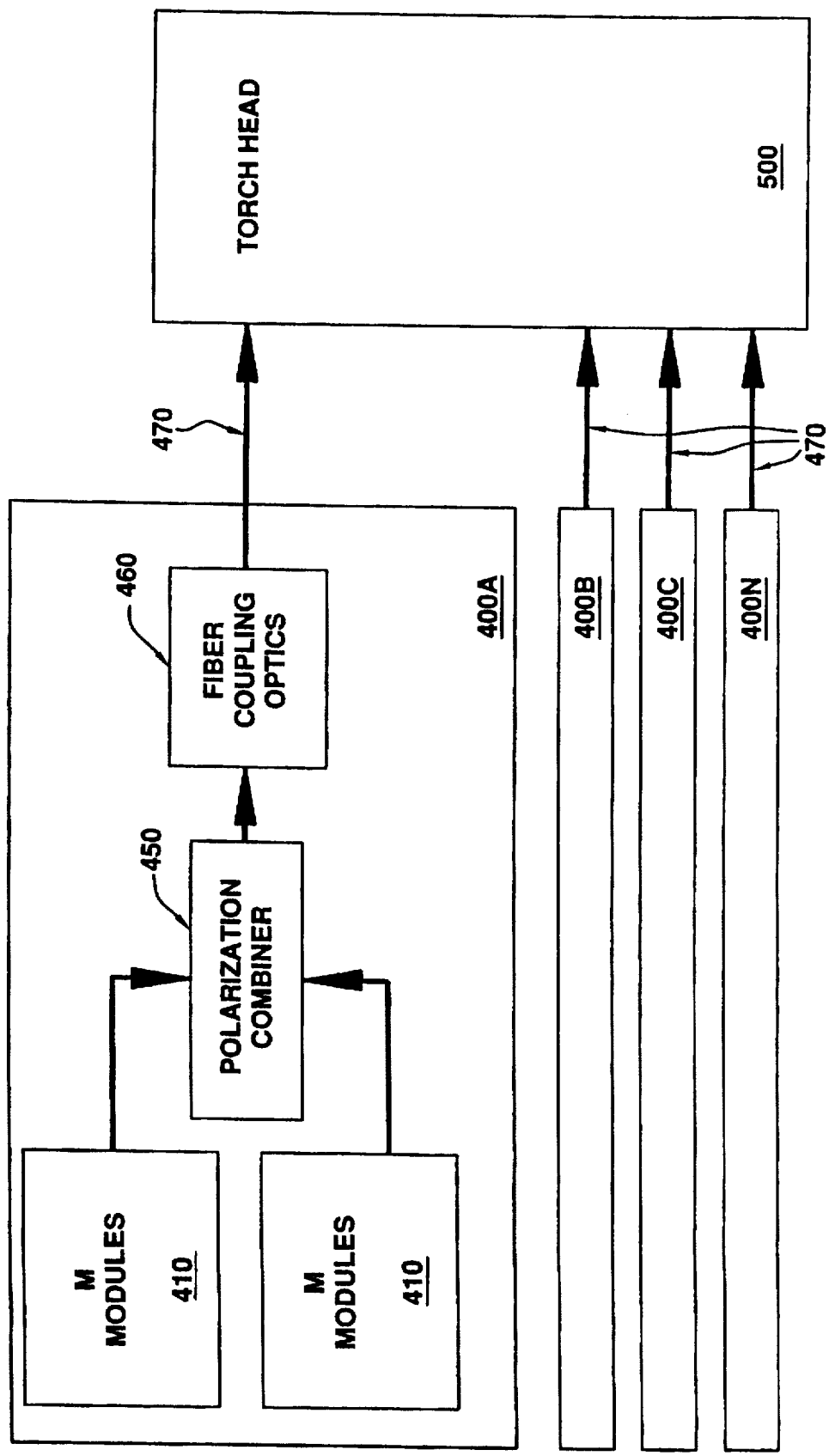
FIG. 6 is a more detailed block diagram of selected components of the high efficiency, high power direct diode laser system shown in FIG. 5.

FIG. 6 is an intermediate level block diagram showing additional details of the LHA 400 and torch head 500 components illustrated in FIG. 5. Advantageously, each of the N LHAs 400 includes M diode laser modules 410, of which the output beams of M/2 modules and combined with the output beams of the other M/2 modules 410 using polarization combiner 450. The combined output beam of each of the N polarization combiners 450 is provided to torch head 500 via fiber coupling optics 460 and a respective optical fiber 470.

Figure 7:
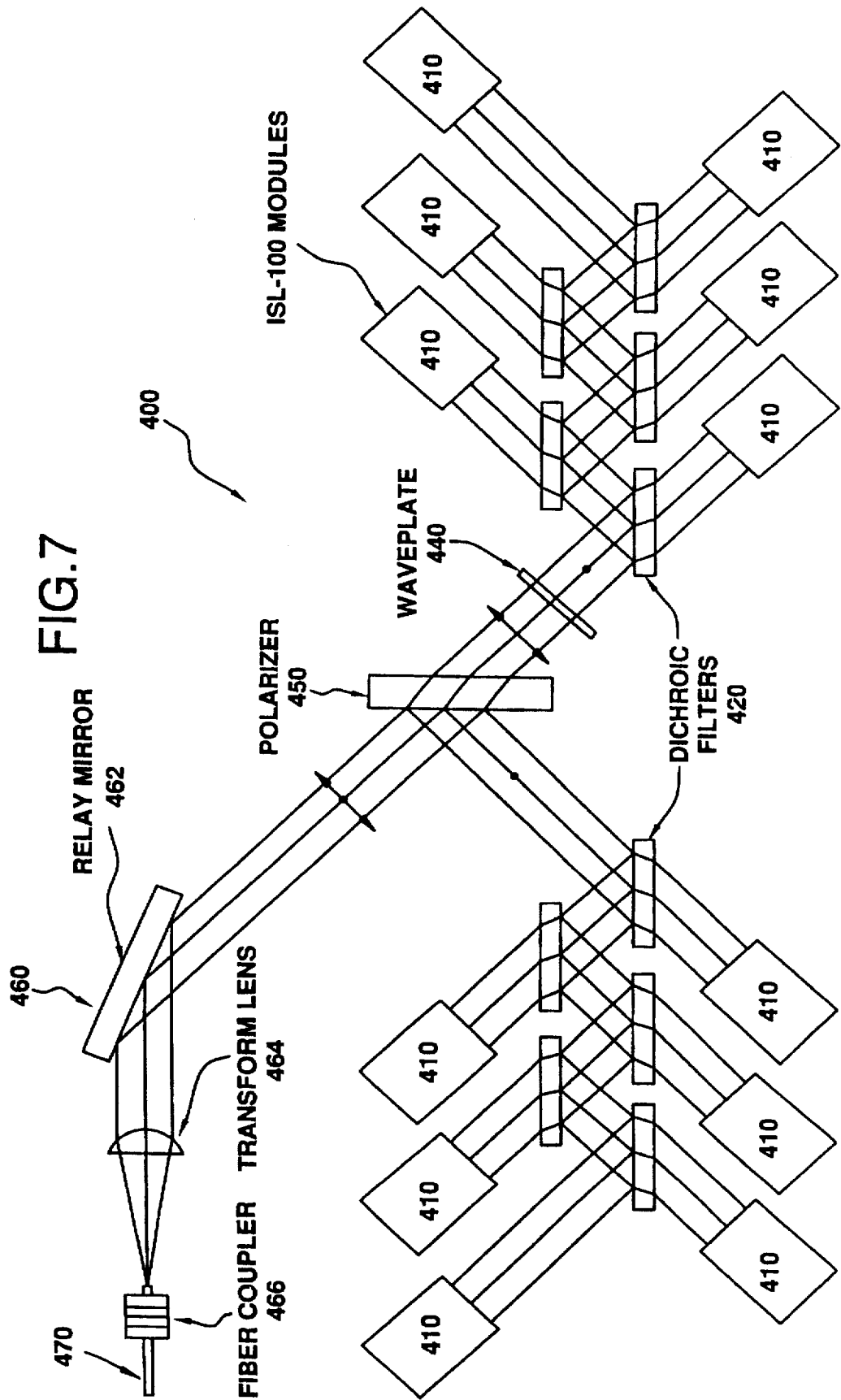
FIG. 7 is a detailed schematic diagram of the optic bed of one of the assemblies illustrated in FIG. 6, which is useful in understanding one facet of system power scaling according to the present invention.

Referring now to FIG. 7, a detailed description of an exemplary embodiment of LHA 400 will now be presented. Preferably, M diode laser modules 410 are disposed on a support plate or optic bed 430 in groups of M/2 modules 410, the left and right groups of modules 410 being disposed on opposite sides of a polarization combiner (polarizer) 450. The output beams of the left set of M/2 modules 410 are combined using (M/2)-1 dichroic filters 420 and directed to the reflecting surface of polarizer 450. The output beams of the right set of M/2 modules 410 are combined using an additional (M/2)-1 dichroic filters 420 and directed to the transmitting surface of polarizer 450 via waveplate 440. Polarizer 450 combines the left and right sets of M/2 laser beams produced by the left and right M/2 module sets in a manner well known to those of ordinary skill in the art.

The output beams of the polarizer 450 are transmitted to the optical fiber 470 via fiber coupling optics 460. Advantageously, fiber coupling optics may include a relay mirror 462, a transform lens 464 and a fiber coupler 466, arranged in that order along the optical path of the LHA 400. Preferably, polarizer 450 and the relay mirror 463 provide 2 axis adjustment while the transform lens 464 provides 5 axis adjustment. In the exemplary case illustrated in FIG. 7, waveplate 440 produces polarization rotation of the output beams of the right group of M/2 modules.

Advantageously, each of the left and right sets of modules 410 produce output beams each having a different single wavelength, the wavelength separation between the output beams being only dependent on the quality of the dichroic filters used in the DLS 1. (M/2)-1 of the modules 410 are disposed behind a respective optical bandpass filter 420 which transmits only the output beam from that module and reflects all other wavelengths of light. Since the module is mechanically independent of the associated dichroic filter 420, the dichroic filters 420 can be aligned separately from the modules 410. After all of the modules 410 are combined in wavelength, then the broadband polarizer 450 is used to combine the output beams from the opposing groups of M/2 modules 410 into a single high brightness beam.

As discussed immediately above and as shown in FIG. 7, twelve 100 watt collimated diode laser modules 410, six each in left and right groups, are combined for launching into a single optical fiber. It should be noted that each module 410 in one of the left and right groups of modules 410 produces laser light at a single selected wavelength. Preferably, the selected wavelength corresponds to the bandpass wavelength of one of the dichroic filters 420. The selected wavelength preferably is within the range of approximately 450 nm to 2.5 microns, and the selected wavelengths preferably all fall within the 760-1050 nm range, with the range of 800-980 nm being most preferable for the exemplary case illustrated in FIG. 7. It should also be mentioned that the minimum differential wavelength for any two of the modules 410 is approximately 10 nm, which corresponds to the minimum band pass of the dichroic filters 420 available using present technology. Thus, the number M of modules 410 in each LHA 400 is 20 for each 100 nm in bandwidth of the output of torch head 500 when both dichroic filters 420 and polarizer 450 are employed and 10 for each 100 nm in bandwidth when only dichroic filters 420 are employed. However, the number M of modules can be increased as the passband of each of the dichroic filters 420 decreases. It should be mentioned that dichroic filters 420 advantageously can be low, high or band pass filters.

It will also be appreciated that the wavelengths produced by the modules 410 advantageously can be selected to facilitate use of the DLS 1. For example, a single one of the modules 410 can produce a wavelength in the visible portion of the spectrum so as to provide a guide beam for reasons of safety.

Figure 8:
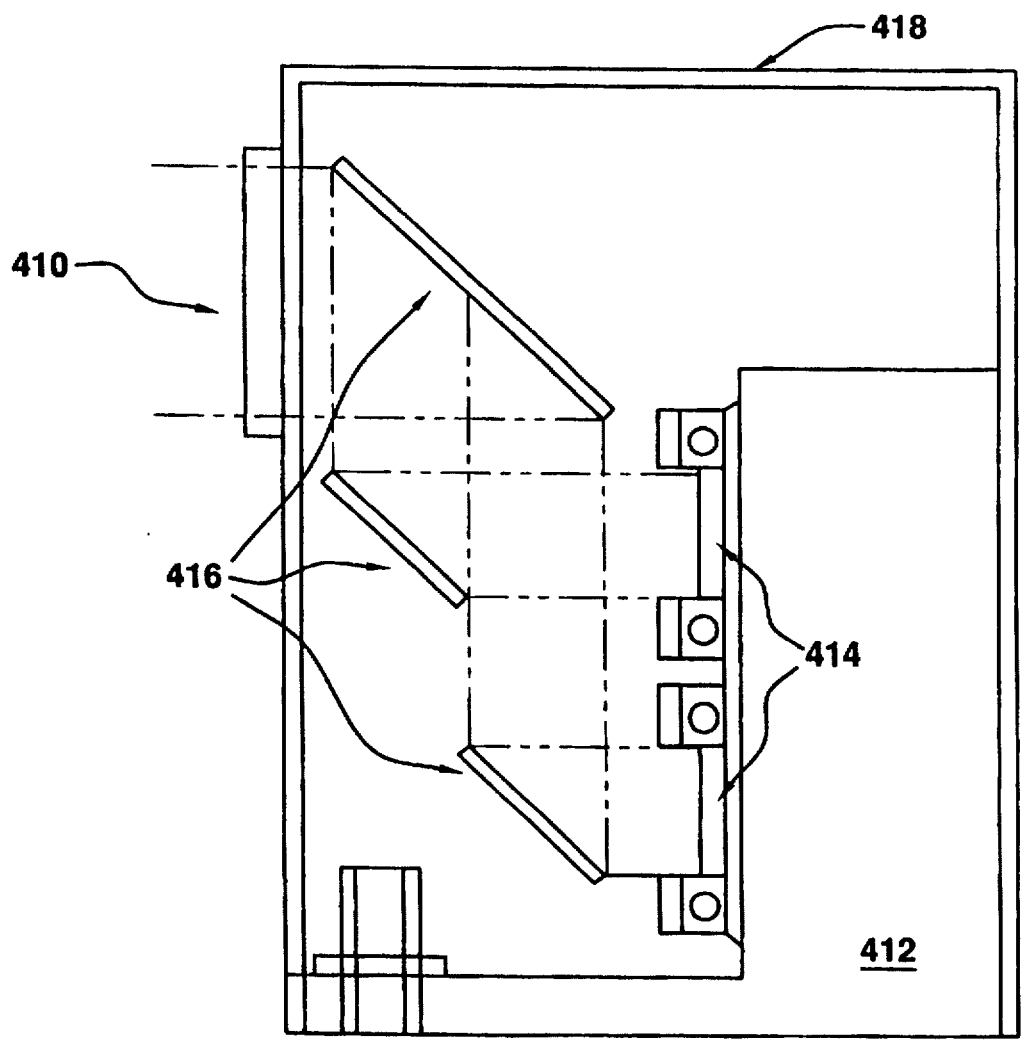
FIG. 8 is a side view of a diode laser array module which can be employed in an exemplary embodiment according to the present invention.

Each of the modules 410 advantageously can be constructed as shown in FIG. 8, wherein a plurality of laser diode arrays 414 are supported by a heatsink 412 within a case 418. Preferably, 3 or more tilt correcting mirrors 416 are used to combine the outputs of the laser diode arrays 414 into a highly collimated output beam. Preferably, each module 410 advantageously includes P laser diodes. It will be appreciated that the only significant limit on the number P is the number of laser diodes which can be effectively cooled.

It should be noted that the modules 410, while similar to those disclosed in U.S. Pat. No. 5,212,707 in some respects, are significantly different in a number of other respects. The modules described in U.S. Pat. No. 5,212,707 were actually fabricated and tested as part of a 100 watt fiber coupled system that was sold by the assignee in 1993. While these modules produced highly collimated laser diode arrays, there have since been several new developments in technology that have enabled the modules 410 to be enhanced vis-a-vis those disclosed in U.S. Pat. No. 5,212,707. For example, the basic emitters used in the patent were index guided devices, i.e., rib lasers. In contrast, the modules 410 according to the present invention advantageously can be gain guided structures, in particular, 20 micron wide oxide defined stripes. While the laser diode array 414 does not produce the same divergence as the index guided structures described in U.S. Pat. No. 5,212,707, they do produce significantly higher output power levels. Moreover, the additional improvements that have developed since the '707 patent was issued include:

(a) The use of high power index guided devices, such those found in Model No. SDL 5410 by Spectra Diode Labs, Inc.;

(b) The use of a tapered oscillator design which is, in general, an oxide defined stripe but with a diverging wavefront; and (c) Improved binary optics, whereby it is no longer necessary to use a refractive element to share the power and collimate the light from the emitters. It will be appreciated that this latter improvement alone increases the effective fluence produced by each of the laser diode arrays 414.

Implementing all of these improvements collectively can dramatically increase the brightness of the module 410 over the original design used in the modules described in U.S. Pat. No. 5,212,707.

Figure 1:
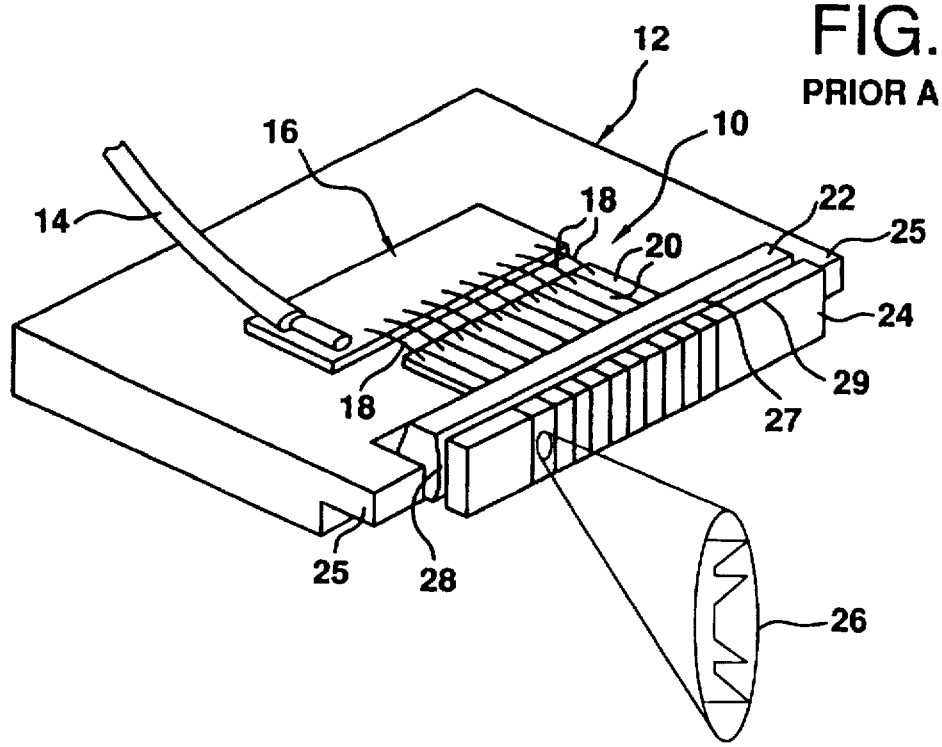
FIG. 1 is a perspective view of a one-dimensional semiconductor laser array assembly, a refractive lens, and a binary optic element.
Figure 4:
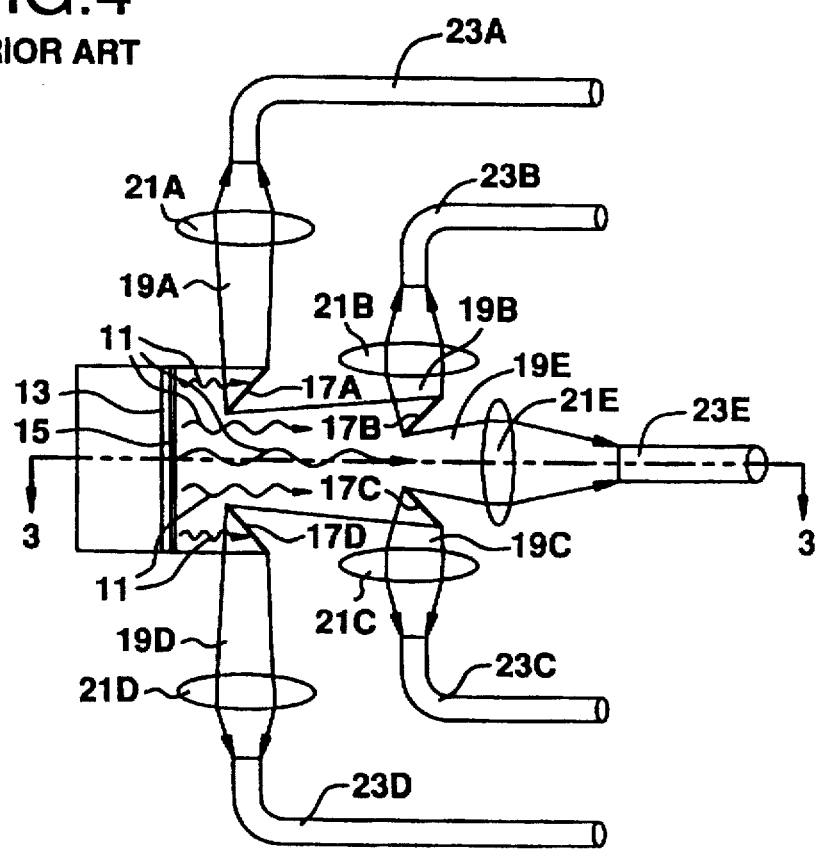
FIG. 4 is a schematic view of an optical system used to couple the outputs of a 1 cm length diode laser stack into five separate fibers.
Figure 2:
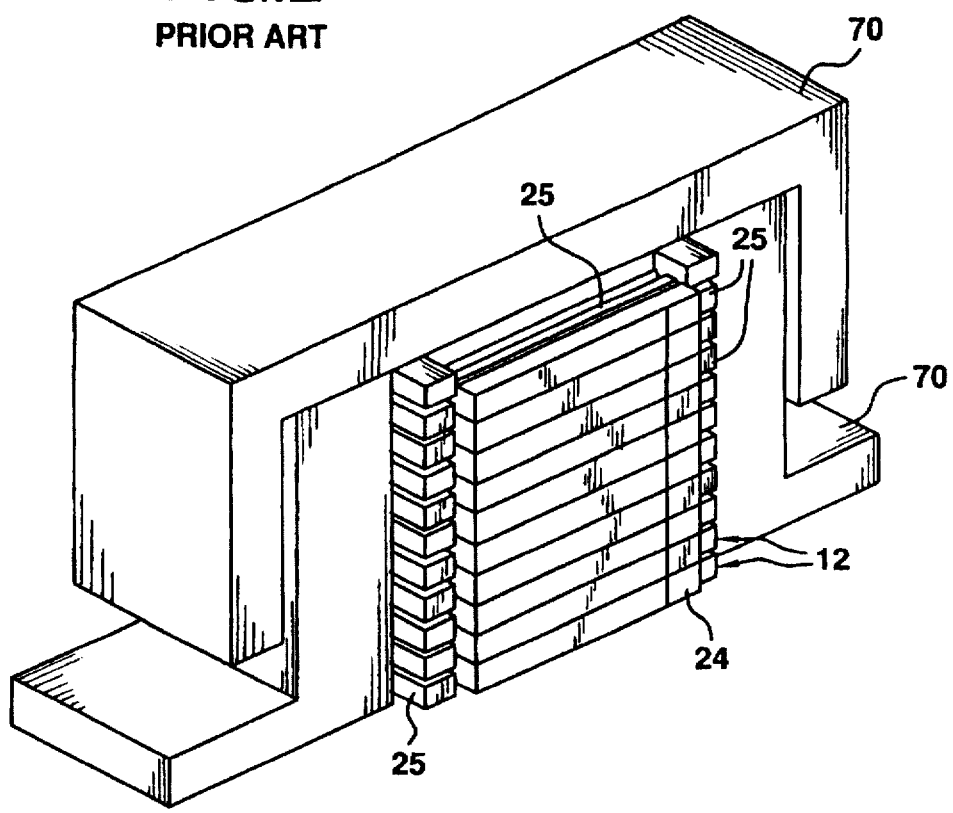
FIG. 2 is a two-dimensional semiconductor laser array and its associated collimating optics held within a clamping fixture.
Figure 3:
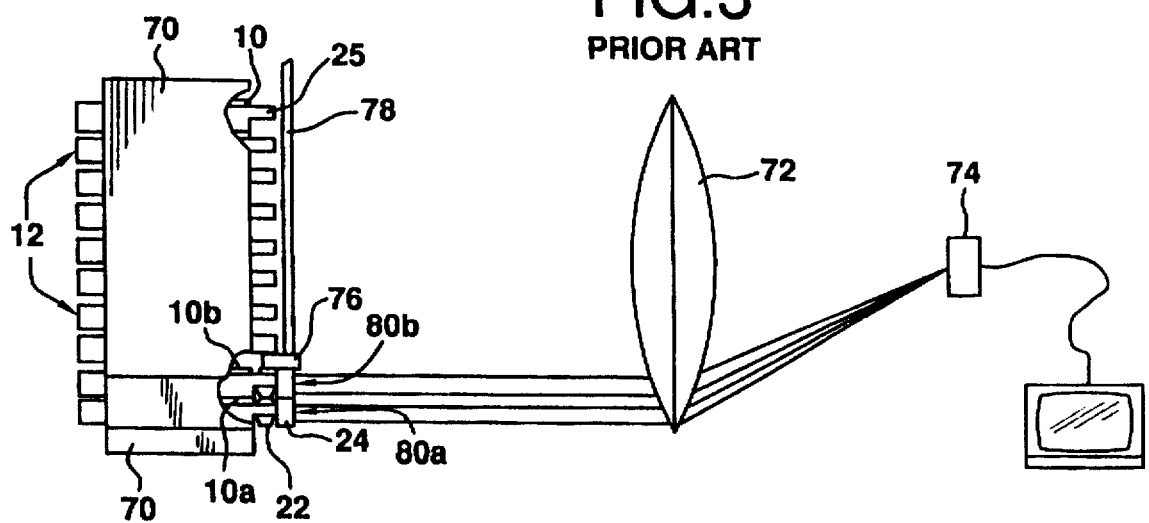
FIG. 3 is a side view of a transform lens in a two-dimensional semiconductor laser array structure illustrating the proper collimation of laser diode outputs by a collimating lens assembly.

It should also be noted that the module 410 illustrated in FIG. 8 includes pointing mirrors 416 in the basic module structure. These pointing mirrors are used to direct the output beam exiting the module 410 through the optical path illustrated in FIG. 7 and into the optical fiber 470. Advantageously, the pointing mirrors 416 provide the fine adjustments required to achieve a high coupling efficiency to the optical fiber 470. It should also be noted that the first commercial systems according to U.S. Pat. No. 5,212,707 provided 100 watt output power by polarization coupling two of the laser diode arrays shown in FIGS. 2 and 3. This approach to intramodule coupling was discarded in favor of the module configuration shown in FIG. 8, which advantageously decreases the overall size of module 410 while increasing fluence at the workpiece.

Another improvement to the basic design of the modules 410 is the use of stackable microchannnel coolers to increase the packing density of the laser diodes and consequently reduce the overall size of the system. Advantageously, cooling systems such as that disclosed in U.S. Pat. No. 5,495,490, which patent is incorporated by reference for all purposes, can be used.

Figure 9:
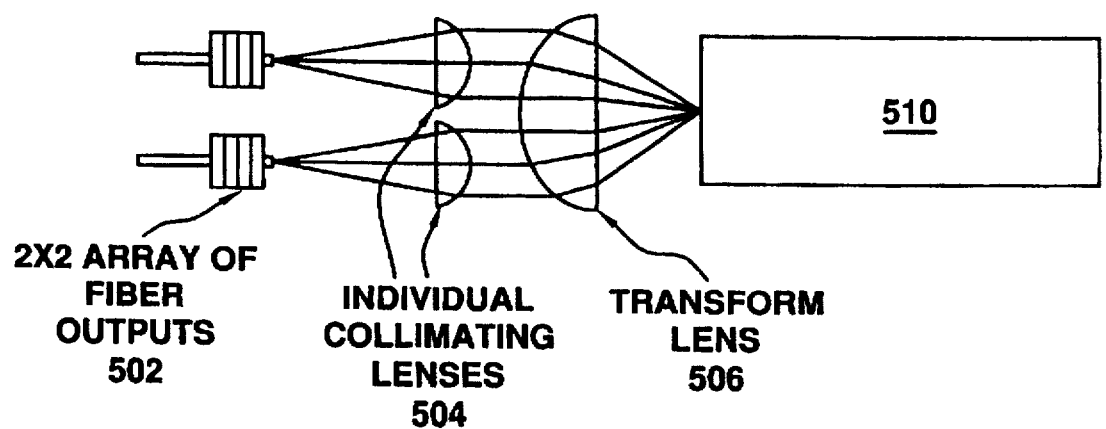
FIG. 9 is an illustration of an exemplary configuration of the torch head assembly of FIG. 5.

Referring to FIG. 9, a preferred embodiment of the torch head 500 includes N collimating lenses 504, which receive output beams from optical fibers 470 via N fiber outputs 502 and which, in conjunction with transform lens 506, focus the N output beams onto a single spot. It will be appreciated that the output of M×N×P laser diodes are focused onto a single spot by torch head 500. Alternatively, it will be appreciated that the output of the LHAs 400 can be combined to end pump a solid state laser rod 510 using an identical or similar structure as that shown in FIG. 9. It should be mentioned that the number of collimating lenses in torch head 500 is N, the number of LHAs 400. It should also be mentioned that the laser rod 510 advantageously can be replaced by either a rare-earth doped optical fiber or a dye laser, i.e., any laser amplifying medium can be serially coupled to head 500.

As discussed above, the DLS 1 shown in FIG. 5 is for an exemplary case in which the output beams of four LHAs 400 are combined to deliver over 3200 watts of cw power to a single focusing lens 506. It should be noted that the output beam of each LHA 400 is produced by dichroic and polarization combining of the outputs of twelve modules 410.

It should be recognized that the output power of the DLS 1 can be varied in a number of ways. First, the number N of LHAs 400 can be varied. For example, doubling the number N of LHAs 400 would double the combined power of the output beams. Alternatively, the number M of modules 410 and corresponding dichroic filters could be varied to vary the output power level. In an exemplary case, reducing the number M from 12 to 6 would halve the output power of that particular LHA 400. Finally, it should be noted that the output power of the DLS 1 can advantageously be varied by controlling either the number M×N of system modules 410 energized or by controlling the excitation power level to some portion of the M×N modules 410. Although the output power can be adjusted by uniformly adjusting the excitation current to the M×N modules 410, it will be appreciated that control at the upper and lower limits of system power may be difficult. For that reason, selected portions of the M×N modules may be controlled while the remainder of the M×N modules 410 may be either on or off, depending on the desired system output power. It should also be recognized that the output power of the selected M×N modules 410 may be varied in accordance with excitation current in a cw operating mode or may be varied in accordance with duty cycle in a pulsed operating mode.

As discussed above, the output of each respective module is fiber coupled to an optical fiber 470. It should be noted that the transform lens 464 focuses and couples the entire output beam of LHA 400 into fiber 470. Preferably, the sine of the convergence angle as the light beam arrives at the light-receiving end of the fiber 470 is less than the numerical aperture NA of that fiber. Advantageously, the NA of the fiber 470 is less than 0.47. Preferably, the NA of the fiber 470 is ≤0.19 and, most preferably, the NA of the optical power is ≤0.16.

Preferably, the fiber coupling lens 464 is a lens designed specifically for focusing the collection of beams from the wide wavelength band system of LHA 400 into the optical fiber 470. The number of modules 410 shown in the exemplary case illustrated in FIG. 7 was chosen to meet the optical power budget required at the fiber output and is entirely dependent on the quality of the optics used. As discussed previously, the only criteria is that the system produce 800 watts out of the fiber and be contained within a 0.16 NA.

Those of ordinary skill in the art will appreciate that the commercial applications range from surgery, to cutting, welding, and heat treating metals. In addition, this DLS 1 will be ideal for paint stripping, curing, cutting and drilling composite materials. Military applications range from an off-gimbal illumination system to a delay denial system for nuclear storage areas.

Another key application for this technology will be as an optical pump for solid state lasers, as discussed above, based on rare earth elements. This configuration facilitates excellent end pumping of a solid state laser rod, rare-earth doped fiber or dye laser. Moreover, this configuration has proven to be the most efficient means yet devised for converting incoherent laser diode pump light into a high quality, high brightness beam.

Although a presently preferred embodiment of the present invention has been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. A diode laser system, comprising:
   N laser head assemblies (LHAs) generating N output beams, wherein each of said N LHAs includes:
   M modules generating M laser beams, wherein each of said M laser beams has a different single wavelength;
   M-2 dichroic filters, wherein each of said M-2 dichroic filters transmits a corresponding one of said M laser beams and reflects all other of said M laser beams;
   a fiber coupling device collecting said M laser beams to produce a respective one of said N output beams;
   N optical fibers receiving respective ones of said N output beams and generating N received output beams; and
   an optical assembly recollimating and focusing said N received output beams on a single spot,
   where N and M are both integers $\geq 2$.

2. The diode laser system as set forth in claim 1, further comprising N LHA controllers controlling the output power produced by respective ones of said N LHAs.

3. The diode laser system as set forth in claim 1, further comprising a LHA controller controlling the output power produced by all of said N LHAs.

4. The diode laser system, as set forth in claim 1, wherein said optical assembly comprises:
   N collimating lenses for recollimating respective ones of said N output beams; and
   a single transform lens focusing said recollimated N output beams onto said single spot.

5. The diode laser system as set forth in claim 4, wherein said single spot corresponds to one end of a solid state laser rod.

6. The diode laser system as set forth in claim 4, wherein said single spot corresponds to one end of a rare earth doped optical fiber.

7. The diode laser system as set forth in claim 1, wherein each of said LHAs comprises:

M/2 first modules generating M/2 first laser beams, wherein each of said M/2 first laser beams has a corresponding single wavelength;

(M/2)-1 dichroic first filters, wherein each of said (M/2)-1 dichroic first filters transmits a corresponding one of said M/2 first laser beams and reflects all other of said M/2 first laser beams;

M/2 second modules generating M/2 second laser beams, wherein each of said M/2 second laser beams has a corresponding single wavelength;

(M/2)-1 dichroic second filters, wherein each of said (M/2)-1 dichroic second filters transmits a corresponding one of said M/2 second laser beams and reflects all other of said M/2 second laser beams;

a polarizer coupling first and second M/2 laser beams to thereby produce M polarization coupled laser beams; and a fiber coupling device collecting said M polarization coupled laser beams to produce a respective one of said N output beams.

8. The diode laser system as set forth in claim 1, wherein said each of said M-2 dichroic filters band pass filters said corresponding one of said M laser beams and reflects all other of said M laser beams.

9. A diode laser system, comprising:

N laser head assemblies (LHAs) generating N output beams, wherein each of said N LHAs includes:

M first modules generating M first laser beams, wherein each of said M first laser beams has a different single wavelength;

M-1 first dichroic filters defining a first optical waveguide for directing all of said M first laser beams into a first optical path, wherein each of said M-1 first dichroic filters transmits a corresponding one of said M first laser beams and reflects all other said M first laser beams;

a fiber coupling device disposed adjacent to said first optical path collecting said M first laser beams to produce a respective one of said N output beams;

N optical fibers receiving respective ones of said N output beams and generating N received output beams; and an optical assembly recollimating and focusing the N received output beams onto a single spot, where N and M are both integers ≧2.

10. The diode laser system as set forth in claim 9, wherein said optical assembly comprises:

N collimating lenses for recollimating said N output beams; and a single transform lens for focusing said recollimated N output beams onto said single spot.

11. The diode laser system as set forth in claim 10, wherein said single spot corresponds to one end of a laser amplifying medium.

12. The diode laser system as set forth in claim 9, wherein each of said LHAs further comprises:

M second modules generating M second laser beams, wherein each of said M second laser beams has a different single wavelength;

M-1 second dichroic filters defining a second optical waveguide for directing all of said M second laser beams into a second optical path, wherein each of said M-1 second dichroic filters transmits a corresponding one of said M second laser beams and reflects all other said M second laser beams;

a rotating element for rotating the polarizations of said M second laser beams; and a polarizer disposed at the intersection of said first and second optical paths coupling said M first and M second laser beams into the second optical path to thereby produce 2M polarization coupled laser beams;

wherein said fiber coupling device collects said 2M polarization coupled laser beams to produce a respective one of said N output beams.

13. The diode laser system as set forth in claim 9, wherein said fiber coupling device comprises a transform lens receiving and coupling said M first laser beams to one of said N optical fibers to thereby produce a respective one of said N output beams.

14. A diode laser system, comprising:

means for generating N laser beams, wherein each of said N laser beams includes multiple wavelengths of light and wherein said generating means comprises:

M first means for generating M first laser beams, wherein each of said M first laser beams has a different single wavelength;

M-1 first filter means defining a first optical waveguide for directing all of said M first laser beams into a first optical path, wherein each of said M-1 first filter means transmits a corresponding one of said M first laser beams and reflects all other said M first laser beams;

fiber coupling means disposed adjacent to said first optical path for collecting said M first laser beams and for producing a respective one of said N output laser beams;

N optical fiber means receiving respective one of said N output laser beams for generating N received output beams; and output means for recollimating and for focusing said N received output beams on a single spot, where N and M are both integers ≧2.

15. The diode laser system as set forth in claim 14, wherein said output means comprises:

N collimating lenses for recollimating said N×M laser beams; and a single transform lens focusing said recollimated N×M laser beams onto said single spot.

16. The diode laser system as set forth in claim 14, wherein said single spot corresponds to one end of a solid state laser.

17. The diode laser system as set forth in claim 14, wherein said single spot corresponds to one end of a rare-earth doped optical fiber.

18. The diode laser system as set forth in claim 14, wherein said single spot corresponds to one end of a dye laser.

19. The diode laser system as set forth in claim 14, wherein said generating means further comprises:

second means for generating M second laser beams, wherein each of said M second laser beams has a different single wavelength;

M-1 second filter means defining a second optical waveguide for directing all of said M second laser beams into a second optical path, wherein each of said M-1 second filter means transmits a corresponding one of said M second laser beams and reflects all other said M second laser beams;

rotating means for rotating the polarizations of said M second laser beams; and polarization means disposed at the intersection of said first and second optical paths for coupling said M first and M second laser beams into said second optical path to thereby produce 2M polarization coupled laser beams, wherein said fiber coupling means collects said 2M polarization coupled laser beams to produce a respective one of said N laser beams.

20. The diode laser system as set forth in claim 19, wherein said fiber coupling device comprises a transform lens for receiving and for coupling said 2M polarization coupled laser beams to one of said N optical fiber means to thereby produce a respective one of said N output beams.

21. A method for generating a high energy laser beam, comprising:

(a) generating P collimated laser beams having an Mth wavelength;

(b) repeating step (a) M times so as to produce M×P collimated laser beams having M different wavelengths;

(c) coupling said M×P collimated laser beams into an optical path;

(d) coupling said M×P collimated laser beams into an ith optical fiber to thereby produce a corresponding ith output laser beam, where i=1 to N;

(e) repeating steps (a) through (d) N times to thereby generate N output laser beams;

(f) recollimating said N output laser beams to produce N recollimated laser beams; and (g) focusing said N recollimated laser beams onto a single spot, where M, N and P are integers $\geq 2$.

22. The method as set forth in claim 21, wherein step (c) comprises dichroically coupling said M×P collimated laser beams into said optical path.

23. The method as set forth in claim 21, wherein step (c) comprises dichroically and polarization coupling said M×P collimated laser beams into said optical path.

24. The method as set forth in claim 21, wherein step (c) comprises polarization coupling said M×P collimated laser beams into said optical path.

* * * * *